(12) United States Patent
Wagner et al.

(10) Patent No.: US 9,281,803 B2
(45) Date of Patent: Mar. 8, 2016

(54) METHOD FOR ACTUATING A NUMBER OF MODULES

(75) Inventors: Thomas Wagner, Reutlingen (DE);
Stephen Schmitt, Nuertingen (DE);
Juergen Hanisch, Bempflingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 710 days.

(21) Appl. No.: 13/637,727

(22) PCT Filed: Mar. 16, 2011

(86) PCT No.: PCT/EP2011/053973
§ 371 (c)(1),
(2), (4) Date: Dec. 26, 2012

(87) PCT Pub. No.: WO2011/120806
PCT Pub. Date: Oct. 6, 2011

(65) Prior Publication Data
US 2013/0140909 A1    Jun. 6, 2013

(30) Foreign Application Priority Data

Mar. 31, 2010   (DE) .......................... 10 2010 003 558

(51) Int. Cl.
| | |
|---|---|
| *G01R 31/28* | (2006.01) |
| *H03K 3/00* | (2006.01) |
| *H04L 12/40* | (2006.01) |
| *H04L 12/403* | (2006.01) |
| *G06F 17/50* | (2006.01) |

(52) U.S. Cl.
CPC ............ *H03K 3/00* (2013.01); *H04L 12/40026* (2013.01); *H04L 12/4035* (2013.01); *G06F 17/5022* (2013.01); *H04L 2012/40241* (2013.01); *Y10T 307/74* (2015.04)

(58) Field of Classification Search
USPC ................................. 307/112; 714/724, 727
See application file for complete search history.

(56) References Cited

U.S. PATENT DOCUMENTS

| | | | |
|---|---|---|---|
| 7,096,139 B2 | 8/2006 | Miyazaki et al. | |
| 2003/0084272 A1* | 5/2003 | Hill | ............................... 712/227 |
| 2005/0225310 A1* | 10/2005 | Smith et al. | ............... 324/121 R |
| 2006/0053343 A1* | 3/2006 | Hayem | ........................... 714/39 |

FOREIGN PATENT DOCUMENTS

| | | |
|---|---|---|
| DE | 10 2008 000 561 | 9/2009 |
| JP | 62-32251 | 2/1987 |
| JP | 62-186034 | 8/1987 |
| JP | 7-197840 | 8/1995 |
| JP | 8-14078 | 1/1996 |
| JP | 8-210168 | 8/1996 |
| JP | 8-210209 | 8/1996 |
| JP | 2000-18068 | 1/2000 |

(Continued)

OTHER PUBLICATIONS

International Search Report, PCT International Application No. PCT/EP2011/053673, dated Sep. 20, 2011.

(Continued)

*Primary Examiner* — Danny Nguyen
(74) *Attorney, Agent, or Firm* — Kenyon & Kenyon LLP

(57) ABSTRACT

A method and a circuit system for actuating a number of modules. The method is carried out using the circuit system, which implements a flexible trigger mechanism.

13 Claims, 2 Drawing Sheets

(56) References Cited

FOREIGN PATENT DOCUMENTS

| JP | 2001-98991 | 4/2001 |
| JP | 2003-254139 | 9/2003 |
| JP | 2003-314355 | 11/2003 |
| JP | 2007-132315 | 5/2007 |
| JP | 2009-57909 | 3/2009 |
| JP | 2009-57928 | 3/2009 |
| JP | 2009-235956 | 10/2009 |
| JP | 2010-180824 | 8/2010 |

OTHER PUBLICATIONS

Hartwich, F., et al., "CAN Network with Time Triggered Communication." Jun. 16, 2011 <retrieved from: http://web.archive.org/web/20010615082442/http://www.can.bosch.com/docu/CIA2000Paper_2.pdf>.

* cited by examiner

METHOD FOR ACTUATING A NUMBER OF MODULES

FIELD OF THE INVENTION

The present invention relates to a method for actuating a number of modules, in particular a number of hardware modules or units, and to a circuit system for carrying out the method.

BACKGROUND INFORMATION

Microcontrollers that are used in various embedded systems control, among others, actuators and sensors. Actuators are distinguished in that they are supplied with signals at particular times and in many cases also must be actuated simultaneously in order to perform a function. Such output signals are typically actuated with highly complex timer architectures. Here, a plurality of output signals can be outputted on the basis of prespecified timestamps, counter values, or by triggering of the cells among one another.

In conventional solution approaches, it has turned out to be disadvantageous that only adjacent cells in an increasing sequence, or chains of cells in an increasing sequence, which may not be interrupted, can mutually trigger one another. If the triggering is carried out on the basis of a time value, previous architectures have the disadvantage that they have to reload the corresponding time values for producing new signals by CPU, which causes a high interrupt load on the main CPU.

SUMMARY

In accordance with an example embodiment of the present invention, an example method provides a flexible trigger mechanism that does not operate only on time bases, but rather also simultaneously allows the triggering and controlling of a plurality of hardware units for signal outputting. The proposed trigger mechanism is flexible enough that non-adjacent modules can also mutually inform one another, switch one another on or off, or trigger the reloading of parameter sets.

An example circuit system in accordance with the present invention is made up of a module that implements the flexible trigger mechanism. Here, the individual connected modules can be wired to one another, and various trigger mechanisms (time, CPU access, other output module(s), etc.) can be set. On the basis of the respective trigger source, it is possible to switch the output units off or on, and/or to switch the respective outputs off or on, and/or to reload a parameter set in parallel fashion.

The example solution is distinguished in that the trigger mechanism can be reprogrammed during the runtime. In conventional approaches, in contrast, this is rigidly prespecified in the multiplexers that are used. Each channel can influence every other channel (feedback) via the provided internal trigger.

The example trigger mechanism can be a component of a timer platform to be used in automotive applications. Alternatively, however, the mechanism can also be used in an industrial setting.

In an example embodiment, a circuit system for a flexible trigger mechanism for at least two modules is provided, in which these at least two modules need not have any special topological feature for the common triggering, and the common triggering need not take place on the basis of a global time base. The described trigger mechanism can be actuated by a time event, a CPU trigger, or a trigger event of one or more connected hardware unit(s). In addition, the output trigger mechanisms can be used in parallel with one another, the output trigger mechanisms being capable of being actuated both by hardware and by software.

In order to produce a time base, or time bases, a time base unit (TBU) can be used that can provide a common time base for the microcontroller. The time base unit, or time base submodule, is organized in channels, the number of channels being independent of the device. At least two channels are implemented inside the TBU. Typically, each of the channels has a time base register having a length of 24 bits. However, other lengths, such as 16 bits, 32 bits, etc., may be provided. The time base channels can be operated independently of one another.

Further advantages and embodiments of the present invention result from the description and from the figures.

Of course, the features described above and explained below may be used not only in the indicated combination, but also in other combinations, or by themselves, without departing from the scope of the present invention.

DETAILED DESCRIPTION OF EXAMPLE EMBODIMENTS

The present invention is schematically shown on the basis of specific example embodiments in the figures, and is described in detail below with reference to the figures.

Figure 1:
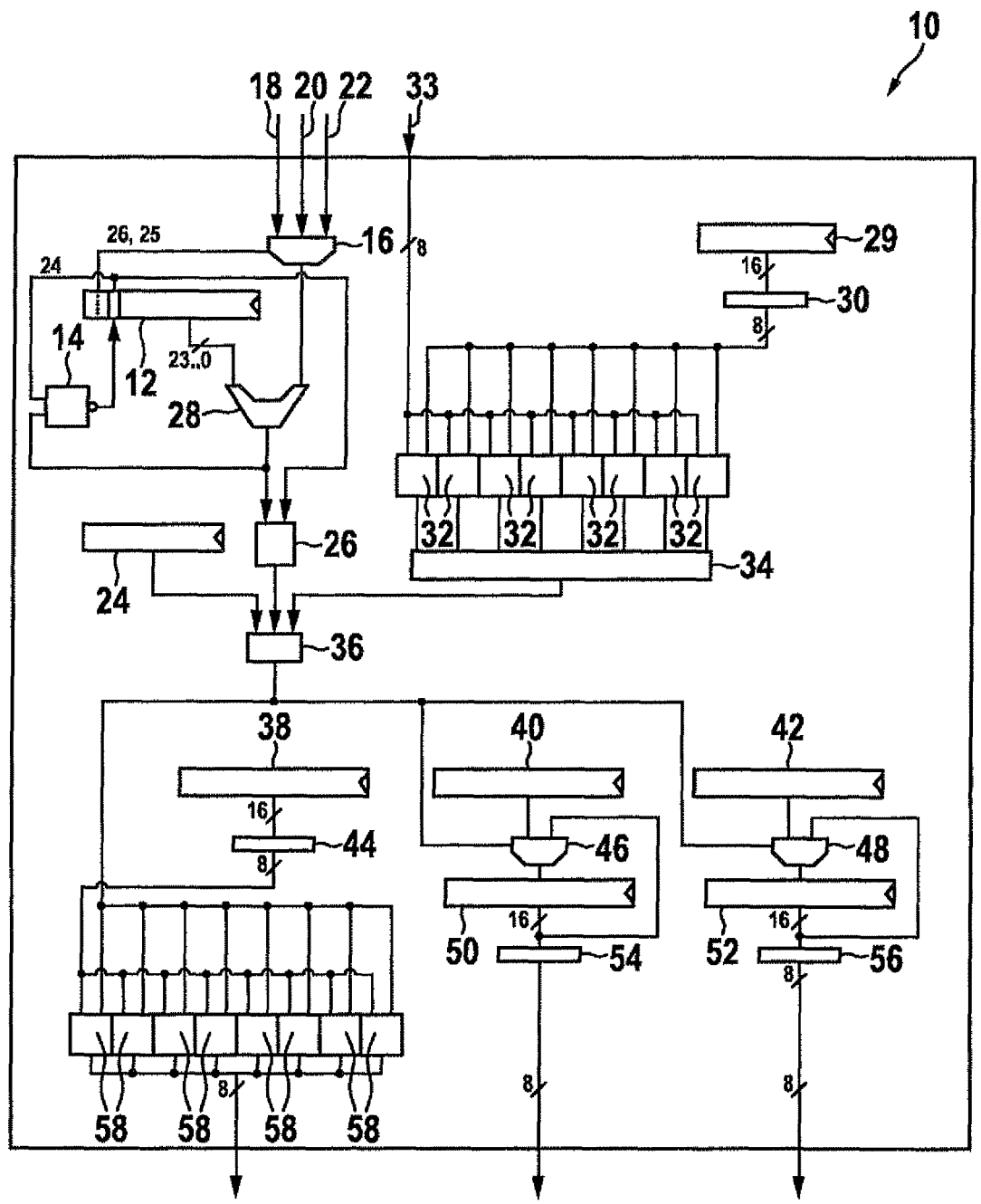
FIG. 1 shows, in a block diagram, a specific example embodiment of the provided circuit system.

FIG. 1 shows, in a block schematic diagram, an example circuit system 10 that implements a central trigger mechanism. The representation shows a register 12 in which there is stored a target value ACT_TB, a first AND gate 14, a multiplexer 16 for inputting time bases TBU_TS2 18, TBU_TS1 20, and TBU_TS0 22, a register 24 for receiving an external trigger Host_Trig inputted via a bus interface, a second AND element 26, a comparator (=<) 28, a further register 29 for a mask of a hardware trigger, an optional encoder 30, eight additional AND gates 32, an interface 33 for inputting signals from external hardware units, a further OR gate (>=1) 34, another OR gate (>=1) 36 that outputs the signal CTRL_TRIG, which is the trigger signal, a further register 38 for the value FUPD_CTRL, a register 40 for the value OUT-EN_CTRL, a further register 42 for the value ENDIS_CTRL, a further optional encoder 44, a further multiplexer 46, another further multiplexer 48, a register 50 for the value OUTEN_STAT, a further register 52 for the value ENDIS_STAT, an optional encoder 54 that outputs the signal OUTEN, another optional encoder 56 that outputs a signal ENDIS, and eight AND gates 58 at whose output a signal FUPD is outputted.

The target value ACT_TB is compared to an input signal that is given by time bases 18 or 20 or 22, and based on the comparison a trigger is actuated.

FIG. 1 shows a central trigger mechanism that provides, as input signals, one or more time bases and/or trigger signals from different modules, and/or contains a bus interface for configuration by a central computing unit or CPU. The signals coming in there can be flexibly combined with one another by the example architecture and can execute corresponding actions at the outputs.

Figure 2:
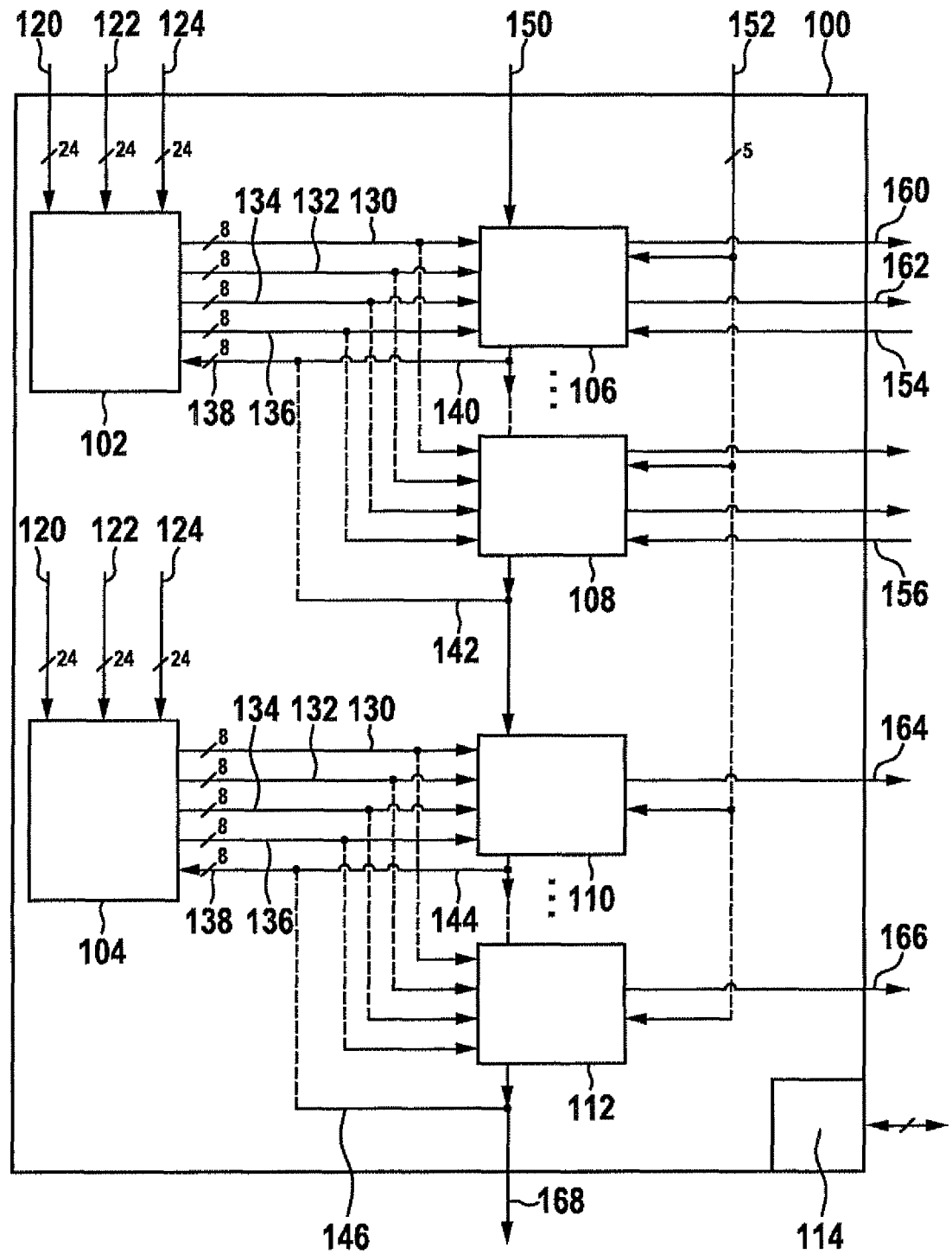
FIG. 2 shows, in a block diagram, the connection of hardware modules to a central trigger mechanism.

FIG. 2 shows a hardware module TOM 100 that in this case is provided as a timer output module and is connected to a central trigger mechanism.

FIG. 2 shows a first trigger channel TGC0 102 and a second trigger channel TGC1 104. Trigger channel TGC0 102 is connected to eight module channels TOM_CH0 106 through TOM_CH7 108. Trigger channel TGC1 104 is connected to eight module channels TOM_CH8 110 through TOM_CH15 112. In addition, an interface 114 for a microcontroller bus is provided.

Values of time bases TBU_TS0 120, TBU_TS1 122, and TBU_TS2 124 are inputted into the two trigger channels 102 and 104 as input signals. Outputs of the two trigger channels 102 and 104 are the signals OUTEN 130, ENDIS 132, FUPD 134, and UPEN 136. In addition, a trigger signal TRIG 138 is provided. This trigger signal 138 is to be divided into TRIG_0 140 through TRIG_7 142, TRIG_8 144 through TRIG_15 146.

Further input signals are TOM_TRIG[i-1] 150, CMU_FX-CLK 152, SPE0_OUT 154, and SPE7_OUT 156 (SPE: Sensor Pattern Evaluation). The SPE is a module that evaluates the inputs of sensors, for example Hall sensors. Output signals are TOM_CH0 160, TOM_CH0_SOUR 162, TOM_CH8_OUT 164, TOM_CH15_OUT 166, and TOM_TRIG_[i] 168.

FIG. 1 shows how the hardware modules that are to be controlled are wired to the flexible trigger mechanism. A part of the structure is responsible for receiving values from time bases (TBU_TSx) and comparing them with a target value (ACT_TB). Here the target value is typically specified by a CPU. This part then generates a corresponding trigger. A second part can be described via the bus interface and can actuate a trigger (HOST_TRIG). A further part combines triggers that can come from hardware units (TOM) (hardware triggers) and derives therefrom a common trigger signal. This part can combine the incoming trigger lines flexibly with one another, so that the topological position occupied by the hardware units that actuate the triggers does not play a role. The input triggers valid for the resulting triggers are specified in a register (INT_TRIG) that is typically described by the CPU.

In addition, the trigger mechanism has output structures that process the overall triggers resulting from the input triggers and actuate corresponding output triggers and actions in the connected hardware modules (TOM). As an output trigger mechanism, for example the switching off or switching on of a plurality of hardware units can take place in parallel (ENDIS_CTRL, ENDIS_STAT). The controlling of whether switching off or switching on takes place is realized using a register 42 ENDIS_CTRL, where those hardware units are marked that are to be jointly switched on or off when the trigger occurs. The current state as to whether a unit is switched on or off can be determined by reading register 52 ENDIS_STAT. In addition, via the bus interface the CPU can directly simultaneously switch a plurality of channels on or off by writing directly to register 52 ENDIS_STAT.

A further output mechanism can connect or disconnect the output signals of the hardware unit (TOM). Here, it is again possible to regulate this via the resulting trigger (OUTEN_CTRL) or from the CPU using register 50 OUTEN_STAT.

A still further output mechanism is the simultaneously forced update of parameters in the connected hardware units (FUPD_CTRL). There, in register 38 it is entered at which of the connected hardware units the parameters are to be simultaneously updated. Of course, the output trigger mechanisms can also be applied to individual hardware modules.

What is claimed is:

1. A method for actuating a number of modules with a circuit system that implements a trigger mechanism, in which at least one trigger signal can be caused by various sources, the method comprising:
   providing flexible triggering, via a flexible triggering arrangement, which is operable based on a time base and which simultaneously allows the triggering and controlling of a plurality of hardware units for signal outputting, wherein the flexible trigger arrangement, having connected modules, flexibly provides for a plurality of trigger types, including a trigger based on the time base, so that output units are switchable on or off, respective outputs are switchable on or off, and/or a parameter set is reloadable in a parallel manner, and wherein the flexible trigger arrangement is reprogrammable during runtime; and
   selecting, as a function of the source, a particular trigger mechanism that actuates a trigger.

2. The method as recited in claim 1, further comprising:
   comparing at least one inputted time base to a target value so that the trigger is actuated by a time event; and
   actuating the trigger.

3. The method as recited in claim 2, wherein the target value is specified by a central computing unit.

4. The method as recited in claim 1, wherein a bus interface is used to input the trigger signal, so that the trigger is actuated by a central computing unit.

5. The method as recited in claim 1, wherein the trigger signal is caused by a connected module, so that the trigger is actuated by a trigger event of a connected module.

6. A circuit system for actuating a number of modules, comprising:
   a circuit arrangement having a flexible trigger arrangement, which is operable based on a time base and which simultaneously allows the triggering and controlling of a plurality of hardware units for signal outputting;
   wherein the flexible trigger arrangement, having connected modules, flexibly provides for a plurality of trigger types, including a trigger based on the time base, so that output units are switchable on or off, respective outputs are switchable on or off, and/or a parameter set is reloadable in a parallel manner,
   wherein the flexible trigger arrangement is reprogrammable during runtime, and
   wherein the flexible trigger arrangement includes a logical gate that combines signals from different sources with one another and produces a trigger signal, wherein a particular trigger mechanism is selected to actuate a trigger as a function of the source.

7. The circuit system as recited in claim 6, wherein an OR gate is used as the logical gate.

8. The circuit system as recited in claim 6, further comprising:
   a multiplexer to input at least one time base;
   a register for a target value; and
   a comparator to compare the time base to the target value.

9. The circuit system as recited in claim 8, further comprising:
   a bus interface.

10. The circuit system as recited in claim 6, further comprising:
    an interface to connect further modules.

11. The circuit system as recited in claim 6, further comprising:
    a bus interface;
    a multiplexer to input at least one time base;
    a register for a target value; and a comparator to compare the time base to the target value;
wherein an OR gate is used as the logical gate.

12. The method as recited in claim 1, further comprising:
comparing at least one inputted time base to a target value so that the trigger is actuated by a time event; and
actuating the trigger;
wherein the target value is specified by a central computing unit, and
wherein a bus interface is used to input the trigger signal, so that the trigger is actuated by a central computing unit.

13. The method as recited in claim 1, further comprising:
comparing at least one inputted time base to a target value so that the trigger is actuated by a time event; and
actuating the trigger;
wherein the target value is specified by a central computing unit, and
wherein the trigger signal is caused by a connected module, so that the trigger is actuated by a trigger event of a connected module.

\* \* \* \* \*